United States Patent
Kawada et al.

(10) Patent No.: US 10,193,054 B2
(45) Date of Patent: Jan. 29, 2019

(54) PIEZOELECTRIC CERAMIC, METHOD FOR PRODUCING PIEZOELECTRIC CERAMIC, AND PIEZOELECTRIC CERAMIC ELECTRONIC COMPONENT

(71) Applicant: Murata Manufacturing Co., Ltd., Nagaokakyo-shi, Kyoto-fu (JP)

(72) Inventors: Shinichiro Kawada, Nagaokakyo (JP); Shoichiro Suzuki, Nagaokakyo (JP); Hideki Ishii, Nagaokakyo (JP); Hiroyuki Hayashi, Nagaokakyo (JP); Suetake Omiya, Nagaokakyo (JP); Takashi Oyama, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 459 days.

(21) Appl. No.: 14/938,166

(22) Filed: Nov. 11, 2015

(65) Prior Publication Data

US 2016/0064646 A1 Mar. 3, 2016

Related U.S. Application Data

(63) Continuation of application No. PCT/JP2014/062595, filed on May 12, 2014.

(30) Foreign Application Priority Data

May 15, 2013 (JP) ................................ 2013-102939

(51) Int. Cl.
*H01L 41/187* (2006.01)
*H01L 41/273* (2013.01)
(Continued)

(52) U.S. Cl.
CPC ........ *H01L 41/1873* (2013.01); *C04B 35/495* (2013.01); *C04B 35/62605* (2013.01);
(Continued)

(58) Field of Classification Search
CPC .......................... H01L 41/187; H01L 41/1873
(Continued)

(56) References Cited

U.S. PATENT DOCUMENTS

2010/0102679 A1* 4/2010 Kawada ................ C04B 35/495
310/363
2013/0234564 A1* 9/2013 Sakashita ................ C23C 26/00
310/365

FOREIGN PATENT DOCUMENTS

JP 2002-029838 A 1/2002
WO WO 2008/152851 A1 12/2008

OTHER PUBLICATIONS

International Search Report issued for PCT/JP2014/062595, dated Aug. 12, 2014.
(Continued)

*Primary Examiner* — Derek Rosenau
(74) *Attorney, Agent, or Firm* — Arent Fox LLP

(57) ABSTRACT

A piezoelectric ceramic that contains an alkali niobate compound as its main ingredient. The alkali niobate compound has a perovskite crystal structure represented by $A_mBO_3$ and contains an alkali metal. There exists Sn in part of site A, and Zr in part of site B. A radial distribution function obtained from a K-edge X-ray absorption spectrum of Sn has a first peak intensity P1 at a first distance from a Sn atom and a second peak intensity P2 at a second distance from the Sn atom. The second distance is greater than the first distance, and the peak intensity ratio P1/P2 is 2.7 or less.

17 Claims, 5 Drawing Sheets

(51) Int. Cl.
*H03H 9/02* (2006.01)
*H03H 9/17* (2006.01)
*H01L 41/083* (2006.01)
*C04B 35/495* (2006.01)
*C04B 35/626* (2006.01)
*C04B 35/64* (2006.01)

(52) U.S. Cl.
CPC ........ *C04B 35/62655* (2013.01); *C04B 35/64* (2013.01); *H01L 41/083* (2013.01); *H01L 41/273* (2013.01); *H03H 9/02543* (2013.01); *H03H 9/178* (2013.01); *C04B 2235/3201* (2013.01); *C04B 2235/3203* (2013.01); *C04B 2235/3208* (2013.01); *C04B 2235/3232* (2013.01); *C04B 2235/3244* (2013.01); *C04B 2235/3262* (2013.01); *C04B 2235/3293* (2013.01); *C04B 2235/6025* (2013.01); *C04B 2235/768* (2013.01)

(58) Field of Classification Search
USPC ........................................................ 310/358
See application file for complete search history.

(56) References Cited

OTHER PUBLICATIONS

Written Opinion of the International Searching Authority issued for PCT/JP2014/062595, dated Aug. 12, 2014.

* cited by examiner

PIEZOELECTRIC CERAMIC, METHOD FOR PRODUCING PIEZOELECTRIC CERAMIC, AND PIEZOELECTRIC CERAMIC ELECTRONIC COMPONENT

CROSS REFERENCE TO RELATED APPLICATIONS

The present application is a continuation of International application No. PCT/JP2014/062595, filed May 12, 2014, which claims priority to Japanese Patent Application No. 2013-102939, filed May 15, 2013, the entire contents of each of which are incorporated herein by reference.

FIELD OF THE INVENTION

The present invention relates to a piezoelectric ceramic, a method for producing a piezoelectric ceramic, and a piezoelectric ceramic electronic component, or more specifically a non-lead piezoelectric ceramic, a method for producing it, and a piezoelectric ceramic electronic component, such as a multilayer piezoelectric actuator, incorporating this piezoelectric ceramic.

BACKGROUND OF THE INVENTION

Multilayer piezoelectric ceramic electronic components, such as multilayer piezoelectric actuators, offering a great displacement even at low voltage have been in growing demand in recent years.

The production of a piezoelectric ceramic electronic component of this type usually involves alternately stacking piezoelectric ceramic layers and conductive layers for use as inner electrodes and cofiring the resulting stack.

It is desirable that the inner electrodes be made of Ni, a material available at relatively low prices.

Ni is easily oxidized when fired in an air atmosphere and needs to be fired in a reducing atmosphere. A piezoelectric material is therefore required that can be cofired in a reducing atmosphere.

Firing a PZT- or PT-based material, which contains Pb, in a reducing atmosphere, however, does not result in desired piezoelectricity because Pb is reduced. Furthermore, Pb is an environmental stressor and its use is unfavorable to the environment.

From this perspective, Patent Document 1 proposes a piezoelectric ceramic composition that contains a main ingredient represented by a general formula $\{(1-x)(K_{1-a-b}Na_aLi_b)(Nb_{1-c}Ta_c)O_3-xM2M4O_3\}$ (where M2 represents at least one of Ca, Ba, and Sr, M4 represents at least one of Zr, Sn, and Hf, and x, a, b, and c meet the following conditions: $0.005 \leq x \leq 0.1$, $0 \leq a \leq 0.9$, $0 \leq b \leq 0.1$, $0 \leq a+b \leq 0.9$, and $0 \leq c \leq 0.3$) and 2 to 15 moles of Mn per 100 moles of the main ingredient, with the M4 content in the range of 0.1 to 5.0 moles per 100 moles of the main ingredient.

In this Patent Document 1, a non-lead alkali niobate compound as the main ingredient is mixed with some particular elements including Mn to the above formulation in order to make the compound more suitable for sintering in a reducing atmosphere, with the intention to prevent incomplete sintering and attain good piezoelectricity even when cofiring the composition with a Ni-based inner electrode material in a reducing atmosphere.

Patent Document 1: International Publication No. 2008/152851 (e.g., Claim 1)

SUMMARY OF THE INVENTION

The results of research conducted by the inventors, however, indicated that piezoelectric ceramic compositions according to Patent Document 1, when used for multilayer piezoelectric actuators, are rather unreliable in long-time and continuous operation under hot and humid conditions because of reduced insulation resistance. They also need to be further improved in terms of piezoelectricity.

The present invention, made under these circumstances, is intended to provide a piezoelectric ceramic that experiences only limited insulation resistance drops even in long-time and continuous operation under hot and humid conditions and can be further improved in piezoelectricity, a method for producing it, and a piezoelectric ceramic electronic component, such as a multilayer piezoelectric actuator, incorporating this piezoelectric ceramic.

The inventors eagerly investigated to attain this object, and their extensive research using perovskite crystal-structured (a general formula $A_mBO_3$) alkali niobate compounds revealed that ensuring that there exists Sn in part of site A and Zr in part of site B limits insulation resistance drops even in long-time and continuous operation under hot and humid conditions, improving the humidity service life and thereby providing a highly reliable piezoelectric ceramic.

The present invention is based on these findings. A piezoelectric ceramic according to the present invention contains an alkali niobate compound as its main ingredient. The alkali niobate compound has a perovskite crystal structure represented by a general formula $A_mBO_3$ and contains at least one alkali metal. There exists Sn in part of site A, and Zr in part of site B.

In general, it is believed that Sn and Zr, when contained in an alkali niobate compound as in the above piezoelectric ceramic, are both present in site B as components of solid solution.

In the present invention, however, part of Sn is intentionally placed in site A in the solid solution to such an extent that a desired humidity service life is obtained. It is therefore needed to identify the sites where Sn exists in the solid solution so that it will be clear that at least part of Sn is in site A.

It is known that the local structure around a particular atom can be characterized using extended X-ray absorption fine structure (hereinafter "EXAFS") analysis. The EXAFS analysis is a technique where a radial distribution function around the particular atom, derived from vibrational structure extracted from an X-ray absorption spectrum of the particular atom, is used to characterize the local structure of the particular atom. This means that the radial distribution function contains information about the coordination environment around the particular atom (the number of atoms proximate to the particular atom, the distance to the proximate atoms, and so forth). The use of radial distribution functions should therefore allow the identification of the sites where particular atoms exist in the solid solution.

In light of this, the inventors conducted exhaustive studies using the EXAFS analysis to identify the sites where Sn atoms as the particular atoms exist in the solid solution. Through these studies the inventors found that any peak intensity ratio P1/P2 of 2.7 or less in a radial distribution function obtained from a K-edge X-ray absorption spectrum of Sn, where P1 represents the peak intensity at a first distance r1 from a Sn atom and P2 represents the peak intensity at a second distance r2 greater than the first distance r1, means that a necessary amount of Sn is in site A in the solid solution, ensuring a desired humidity service life and providing a piezoelectric ceramic having good piezoelectricity.

A piezoelectric ceramic according to the present invention therefore contains an alkali niobate compound as its main ingredient, the alkali niobate compound having a perovskite crystal structure and containing at least one alkali metal, and also contains Sn and Zr. A radial distribution function obtained from a K-edge X-ray absorption spectrum of the Sn has a first peak intensity P1 at a first distance r1 from an atom of the Sn and a second peak intensity P2 at a second distance r2 from the atom of the Sn. The second distance r2 is greater than the first distance r1, and the peak intensity ratio P1/P2, the ratio of the first peak intensity P1 to the second peak intensity P2, is 2.7 or less (including 0).

Simply specifying the peak intensity ratio P1/P2 in this way means that a necessary amount of Sn is in site A in the solid solution, ensuring a desired humidity service life and providing a piezoelectric ceramic having good piezoelectricity.

For a piezoelectric ceramic according to the present invention, furthermore, it is preferred that the peak intensity ratio P1/P2 be 1.7 or more and 2.7 or less.

For the first peak intensity P1 and the second peak intensity P2, Sn is supposed to be present in any of sites A and B in the solid solution, and in the perovskite crystal-structured alkali niobate compound, given the relationship between the distance from a site-A atom to a coordinating O atom and that from a site-B atom to a coordinating O atom, the first peak intensity P1 should represent the presence of Sn in site B in the solid solution, and the second peak intensity P2 the presence of Sn in site A in the solid solution.

For a piezoelectric ceramic according to the present invention, therefore, the perovskite crystal structure is represented by a general formula $A_mBO_3$, the first peak intensity P1 represents the presence of the Sn in site B in the solid solution, and the second peak intensity P2 represents the presence of the Sn in site A in the solid solution.

This allows the identification of the fact that at least part of Sn is in site A in the solid solution.

For a piezoelectric ceramic according to the present invention, furthermore, the peak intensity ratio P1/P2 is calculated through the analysis of a radial distribution function derived from an EXAFS vibration obtained from a K-edge X-ray absorption spectrum of Sn.

This way of using the EXAFS analysis allows the user to derive a radial distribution function that contains local information about the vicinity of Sn atoms and to understand the relationship between the distance from a Sn atom and the peak intensity of a vibration on the basis of this radial distribution function.

For a piezoelectric ceramic according to the present invention, furthermore, it is preferred that the X-ray absorption spectrum be measured at room temperature.

Note that in the present invention, the aforementioned "main ingredient" means that the quantity of the ingredient in the piezoelectric ceramic is 50% by weight or more.

For a piezoelectric ceramic according to the present invention, furthermore, it is preferred that the at least one alkali metal be selected from K, Na, and Li.

Further active research by the inventors also revealed that ensuring that the piezoelectric ceramic contains such amounts of Sn and Zr that the molar quantity of Sn relative to the molar quantity of the at least one alkali metal, expressed as a molar ratio, is in the range of 0.005 to 0.100 and that the molar quantity of Zr relative to the molar quantity of the at least one alkali metal, expressed as a molar ratio, is in the range of 0.005 to 0.100 improves not only the humidity service life but also piezoelectric properties such as the electromechanical coupling coefficient and the piezoelectric constant.

For a piezoelectric ceramic according to the present invention, therefore, it is preferred that the molar quantity of the Sn relative to the molar quantity of the at least one alkali metal, expressed as a molar ratio, be in the range of 0.005 to 0.100 and that the molar quantity of the Zr relative to the molar quantity of the at least one alkali metal, expressed as a molar ratio, be in the range of 0.005 to 0.100.

Presence of Mn in the piezoelectric ceramic would also improve not only the humidity service life but also piezoelectric properties such as the electromechanical coupling coefficient and the piezoelectric constant. In this case, however, Mn needs to be adjusted to make it contained in such an amount that its quantity relative to the molar quantity of the at least one alkali metal, expressed as a molar ratio, is in the range of 0.02 to 0.10.

For a piezoelectric ceramic according to the present invention, therefore, it is preferred that Mn be contained therein with the quantity of Mn relative to the molar quantity of the at least one alkali metal, expressed as a molar ratio, in the range of 0.02 to 0.10.

This piezoelectric ceramic having a good humidity service life can be obtained through the use of SnO or any other Sn compound containing divalent Sn and calcination and firing in a reducing atmosphere.

A method according to the present invention for producing a piezoelectric ceramic therefore includes a weighing step that involves weighing out ceramic raw materials including an alkali metal compound containing an alkali metal, a Sn compound containing divalent Sn, a Nb compound containing Nb, and a Zr compound containing Zr, a calcination step that involves mixing the weighed ceramic raw materials and subsequently calcining the mixture in a reducing atmosphere to produce a ceramic feedstock powder, an article-shaping step that involves shaping the ceramic feedstock powder into an article, and a firing step that involves firing the article in a reducing atmosphere.

In a method according to the present invention for producing a piezoelectric ceramic, it is preferred that the weighing step involve weighing out such amounts of the ceramic raw materials that the post-firing molar quantity of the Sn relative to the molar quantity of the alkali metal, expressed as a molar proportion, will be in the range of 0.005 to 0.100 and that the post-firing molar quantity of the Zr relative to the molar quantity of the alkali metal, expressed as a molar ratio, will be in the range of 0.005 to 0.100.

In a method according to the present invention for producing a piezoelectric ceramic, furthermore, it is preferred that the ceramic raw materials include a Mn compound containing Mn and that the weighing step involve weighing out such amounts of the ceramic raw materials that the post-firing molar quantity of Mn relative to the molar quantity of the alkali metal, expressed as a molar ratio, will be in the range of 0.02 to 0.10.

This also allows the production of a piezoelectric ceramic that has not only its humidity service life but also piezoelectric properties such as the electromechanical coupling coefficient and the piezoelectric constant improved.

A piezoelectric ceramic electronic component according to the present invention is a piezoelectric ceramic electronic component having a piezoelectric ceramic body and an outer electrode on a surface of the piezoelectric ceramic body and is characterized in that the piezoelectric ceramic body is made of any of the piezoelectric ceramics described above.

For a piezoelectric ceramic electronic component according to the present invention, it is preferred that the piezoelectric ceramic body have an inner electrode embedded therein, the inner electrode containing Ni as its main ingredient.

This provides a low-cost way to obtain a multilayer piezoelectric ceramic electronic component, such as a multilayer piezoelectric actuator, with a good humidity service life and high reliability.

A piezoelectric ceramic according to the present invention contains, as its main ingredient, an alkali niobate compound having a perovskite crystal structure represented by a general formula $A_mBO_3$ and containing at least one alkali metal (such as K, Na, or Li), with Sn existing in part of site A and Zr in part of site B. This limits insulation resistance drops even in long-time operation under hot and humid conditions, thereby improving the humidity service life of the piezoelectric ceramic.

A piezoelectric ceramic according to the present invention contains Sn and Zr in addition to its main ingredient, an alkali niobate compound that has a perovskite crystal structure and contains at least one alkali metal. A radial distribution function obtained from a K-edge X-ray absorption spectrum of the Sn has a first peak intensity P1 at a first distance r1 from an atom of the Sn and a second peak intensity P2 at a second distance r2 from the atom of the Sn. The second distance r2 is greater than the first distance r1. The peak intensity ratio P1/P2, the ratio of the first peak intensity P1 to the second peak intensity P2, is 2.7 or less (including 0). Simply specifying the peak intensity ratio P1/P2 means that a necessary amount of Sn is in site A in the solid solution, ensuring a desired humidity service life and providing a piezoelectric ceramic having good piezoelectricity.

A method according to the present invention for producing a piezoelectric ceramic includes a weighing step that involves weighing out ceramic raw materials including an alkali metal compound containing an alkali metal, a Sn compound containing divalent Sn, a Nb compound containing Nb, and a Zr compound containing Zr, a calcination step that involves mixing the weighed ceramic raw materials and calcining the mixture in a reducing atmosphere to produce a ceramic feedstock powder, an article-shaping step that involves shaping the ceramic feedstock powder into an article, and a firing step that involves firing the article in a reducing atmosphere. Through the heating of the Sn compound containing divalent Sn and the Zr compound in a reducing atmosphere, this method allocates Sn in site A and Zr in site B without changing their valence, thereby yielding a piezoelectric ceramic having a good humidity service life and high reliability.

A piezoelectric ceramic electronic component according to the present invention has a piezoelectric ceramic body and an outer electrode on a surface of the piezoelectric ceramic body, and the piezoelectric ceramic body is made of any of the piezoelectric ceramics described above. This allows the production of a variety of piezoelectric ceramic electronic components with a good humidity service life and high reliability.

DETAILED DESCRIPTION OF THE PREFERRED EMBODIMENTS

Figure 1:
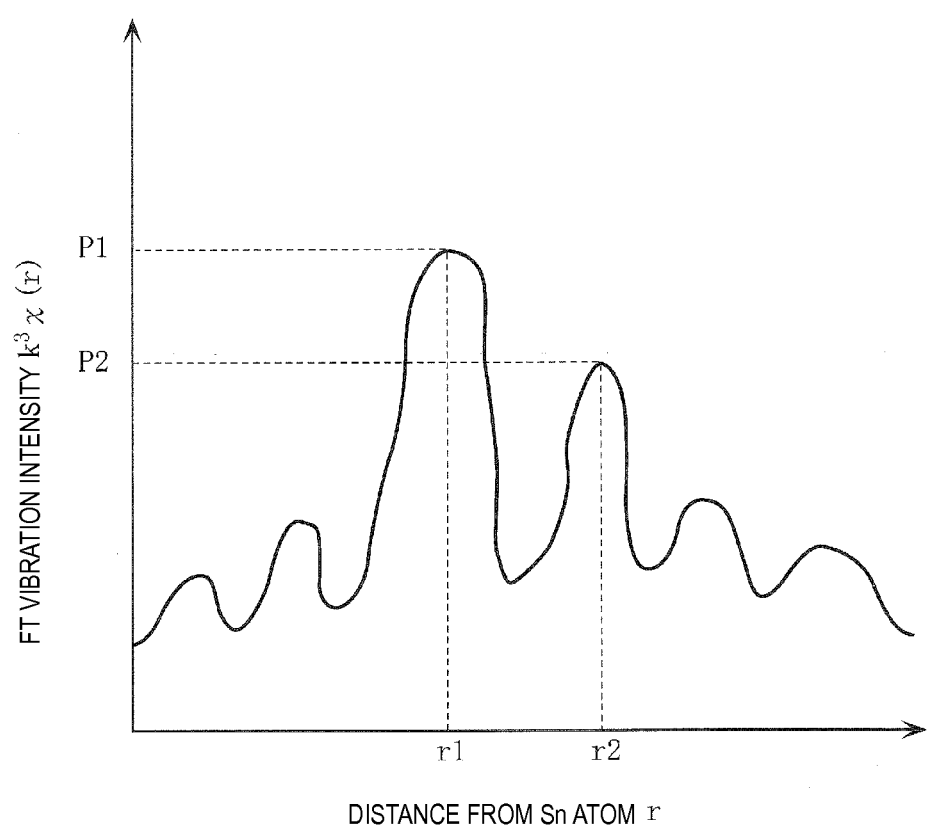
FIG. 1 is a diagram illustrating an example of a radial distribution function obtained from a K-edge X-ray absorption spectrum of Sn contained in a piezoelectric ceramic according to the present invention.

The following describes some embodiments of the present invention in detail.

A piezoelectric ceramic according to the present invention contains an alkali niobate compound as its main ingredient. The alkali niobate compound has a perovskite crystal structure represented by a general formula $A_mBO_3$ and contains at least one alkali metal. There exists Sn in part of site A, and Zr in part of site B.

The at least one alkali metal can be of any metal or metals in that class and usually is at least one of K, Na, and Li.

A piezoelectric ceramic according to the present invention can therefore be represented by general formula (1).

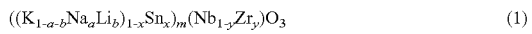

$$((K_{1-a-b}Na_aLi_b)_{1-x}Sn_x)_m(Nb_{1-y}Zr_y)O_3 \quad (1)$$

Ensuring that there exists Sn in part of site A and Zr in part of site B in this way limits insulation resistance drops even in long-time operation under hot and humid conditions, thereby providing a piezoelectric ceramic having a good humidity service life and high reliability.

The reason for the improved humidity service life is unclear. Presumably, stable presence of Sn and Zr in sites A and B, respectively, in the solid solution stabilizes the overall charge balance, improving the humidity service life.

As mentioned above, it is important for a good humidity service life to be obtained that there exists Sn in part of site A and Zr in part of site B. Furthermore, specifying the molar quantities of Sn and Zr relative to the at least one alkali metal further improves not only the humidity service life but also piezoelectric properties such as the electromechanical coupling coefficient and the piezoelectric constant.

To be specific, it is preferred that the molar quantity of Sn relative to the molar quantity of the at least one alkali metal, expressed as a molar ratio, be in the range of 0.005 to 0.100 and that the molar quantity of Zr relative to the molar quantity of the at least one alkali metal, expressed as a molar ratio, be in the range of 0.005 to 0.100. Making any one of the molar quantities of Sn and Zr out of the respective ranges would lead to insufficient additional improvement of piezoelectric properties such as the electromechanical coupling coefficient and the piezoelectric constant, although the humidity service life would be good.

Presence of Mn in the piezoelectric ceramic would also improve not only the humidity service life but also piezoelectric properties such as the electromechanical coupling coefficient and the piezoelectric constant because Mn contributes to making the ceramic more suitable for sintering in a reducing atmosphere. In this case, it is preferred that Mn be contained in such an amount that the quantity of Mn relative to the molar quantity of the at least one alkali metal, expressed as a molar ratio, is in the range of 0.02 to 0.10.

Even if the at least one alkali metal is K, Na, and/or Li, the molar formulation ratio between these alkali metals is not limited. For good piezoelectricity to be ensured, however, it is preferred that in general formula (1), the molar formulation ratio a of Na be 0.9 or less and the molar formulation ratio b of Li be 0.1 or less with the total of their molar formulation ratios (a+b) being 0.9 or less.

As for the molar formulation ratio m between sites A and B, stoichiometrically 1.000, it would be preferred to make it site A-rich or site B-rich as necessary, unless this affects characteristics.

This piezoelectric ceramic, therefore, contains an alkali niobate compound as its main ingredient, the alkali niobate compound having a perovskite crystal structure represented by a general formula $A_mBO_3$ and containing at least one alkali metal (such as K, Na, or Li), with Sn existing in part of site A and Zr in part of site B. This limits insulation resistance drops even in long-time operation under hot and humid conditions, thereby improving the humidity service life of the piezoelectric ceramic.

Furthermore, this piezoelectric ceramic allows the sites where Sn exists in the solid solution to be identified through EXAFS-based analysis of a radial distribution function obtained from a K-edge X-ray absorption spectrum of Sn.

To be specific, irradiating a sample with an X-ray corresponding to the energy for the ionization of the electrons in the K-shell (1s orbital), an inner shell of an atom, excites the K-shell electrons and produces an absorption edge, a region where the absorbance suddenly increases. When the energy of the incident X-ray is continuously shifted to the high-energy side with respect to the absorption edge, photoelectrons emitted from the X-ray-absorbing atom are scattered by the proximate atoms. The wave of the emitted photoelectrons and the wave of electrons backscattered by the proximate atoms interfere with each other, resulting in a vibrational fine structure in the X-ray absorption spectrum.

Subtracting the individual background in the pre-edge region, a region on the low-energy side with respect to the absorption edge of the Sn atom, and the post-edge region, a region on the high-energy side with respect to the K-absorption edge, from the X-ray absorption spectrum therefore extracts the vibrational structure (EXAFS vibration).

Applying a Fourier transform to the EXAFS vibration with a setting of window function, such as the Hanning window, derives a radial distribution function.

Incidentally, it is known that in the EXAFS analysis, the EXAFS vibration $\chi(k)$ is described as a function of the wave number k, as in mathematical representation (1), in accordance with the multiple-scattering theory for photoelectrons.

[Math. 1]

$$\chi(k) = S_0^2 \sum \frac{c_i N_i F_i(k)}{kr_i^2} e^{k^2 \sigma_i^2} \sin(2kr_i + \phi_i(k)) \quad (1)$$

In this equation, $N_i$ is the number of equivalent scattering atoms i proximate to the X-ray-absorbing atom (coordination number), $r_i$ is the distance from the X-ray-absorbing atom to a scattering atom i, $\phi_i$ is the phase shift in the wave of the photoelectron caused by the potential that the emitted X-ray absorption atom and scattering atoms i form, and $F_i$ is the scattering amplitude of the electrons backscattered by the scattering atoms i. $S_0^2$ is an attenuation factor unique to the X-ray-absorbing element and is a constant determined from the EXAFS vibration of reference standard. $\sigma_i^2$ is the Debye-Waller factor, which indicates the attenuation of the EXAFS vibration caused by atomic thermal vibrations and structural fluctuations. $C_i$ indicates the proportion of X-ray-absorbing atoms in a different coordination environment.

It is therefore possible to calculate a theoretical EXAFS vibration by determining the above structural parameters in mathematical representation (1) on the basis of an assumed model of the local structure around the X-ray-absorbing atom and computing on the FEFF program or any other computing program. Applying a Fourier transform to the theoretical EXAFS vibration with a setting of window function, such as the Hanning window, derives a theoretical radial distribution function.

The inventors constructed a theoretical radial distribution function through the modeling of a local structure where Sn exists in sites A and B of a perovskite crystal-structured alkali niobate compound, and performed curve fitting to compare it with a radial distribution function derived from the K-edge EXAFS vibration of Sn with the distance from the Sn atom r and the percentage presence of Sn in site A in the solid solution as parameters. The results indicated substantial agreement between the derived and theoretical radial distribution functions.

This substantial agreement between measured and theoretical radial distribution functions means that it is possible to derive many theoretical radial distribution functions with different percentages of the presence of Sn in site A in the solid solution through a simulation that uses the distance from the Sn atom r and the percentage presence of Sn in site A.

These theoretical radial distribution functions contain information about the local structure around the Sn atom including the number of O atoms next to the Sn atom, the distances between these atoms, and the percentages of Sn in sites A and B in the solid solution.

FIG. 1 is an example of a theoretical radial distribution function obtained from a K-edge X-ray absorption spectrum of Sn. The horizontal axis represents the distance from the Sn atom r, and the vertical axis the intensity of vibration after the Fourier transform (FT vibration intensity) $k^3\chi(r)$.

The theoretical radial distribution function of Sn has a peak intensity P1 at a first distance r1 from the Sn atom and a peak intensity P2 at a second distance r2 greater than the first distance r1. For a desired humidity service life to be ensured, it is important that the peak intensity ratio P1/P2 be 2.7 or less (including 0).

In other words, simply making the peak intensity ratio P1/P2 2.7 or less ensures a desired humidity service life and provides a desired piezoelectric ceramic, eliminating the need to identify the sites where Sn exists in the solid solution.

It is, however, known that in an alkali niobate compound having a perovskite crystal structure, the distance between a site-A atom and a coordinating O atom is greater than that between a site-B atom and a coordinating O atom. The peak intensity P1 should therefore represent the presence of Sn in the site for Nb, or site B, in the solid solution, and the peak intensity P2 the presence of Sn in the site for alkali metals, or site A, in the solid solution.

The atmosphere where the X-ray absorption spectrum is measured is not limited. It is, however, preferred to measure it at room temperature (e.g., 25±1° C.). A radial distribution function obtained from an X-ray absorption spectrum can have varying peak intensities P1 and P2 and first and second distances r1 and r2 according to the temperature of measurement.

This piezoelectric ceramic, therefore, contains an alkali niobate compound as its main ingredient, the alkali niobate compound having a perovskite crystal structure and containing at least one alkali metal, and also contains Sn and Zr. A radial distribution function obtained from a K-edge X-ray absorption spectrum has a first peak intensity P1 at a first distance r1 from an atom of the Sn and a second peak intensity P2 at a second distance r2 from the atom of the Sn. The second distance r2 is greater than the first distance r1, and the peak intensity ratio P1/P2, the ratio of the first peak intensity P1 to the second peak intensity P2, is 2.7 or less (including 0). Simply specifying the peak intensity ratio P1/P2 means that a necessary amount of Sn is in site A in the solid solution, providing a piezoelectric ceramic having a desired humidity service life and good piezoelectricity.

The foregoing description is about Sn because it is important in the present invention to identify the sites where the alkali niobate compound in the form of a solid solution contains Sn, which has been considered to exist in site A. However, the sites where Zr exists in the solid solution can also be identified through the same method and procedure.

The following describes a method for producing this piezoelectric ceramic.

First, the following ceramic raw materials are prepared: an alkali metal compound containing an alkali metal, a Nb compound containing Nb, a Sn compound containing divalent Sn, a Zr compound containing Zr, and optionally a Mn compound containing Mn.

The reason why the Sn compound is one that contains divalent Sn is that with a Sn compound that contains tetravalent Sn, Sn would be likely to present in site B in the solid solution, rather than site A, because of its valence.

The form of the compounds is not limited. They can be in the form of an oxide, a carbonate, or a hydroxide.

These ceramic raw materials are weighed out in such amounts that the post-firing molar quantity of Sn relative to the molar quantity of the alkali metal, expressed as a molar proportion, will be preferably in the range of 0.005 to 0.100, that the molar quantity of Zr relative to the molar quantity of the alkali metal, expressed as a molar ratio, is in the range of 0.005 to 0.100, and optionally that the post-firing molar quantity of Mn relative to the molar quantity of the alkali metal, expressed as a molar ratio, will be in the range of 0.02 to 0.10.

The weighed materials are put into a ball mill containing a milling medium such as PSZ (partially stabilized zirconia) balls and thoroughly wet-milled in the presence of a solvent such as ethanol to form a mixture.

After being dried, the mixture is calcined for synthesis at a predetermined temperature (e.g., 850° C. to 1000° C.) in a reducing atmosphere in which Sn will sit in site A in the solid solution without being oxidized (e.g., an oxygen partial pressure of $1.0 \times 10^{-16}$ to $1.0 \times 10^{-14}$ MPa). This yields a ceramic feedstock powder.

The ceramic feedstock powder obtained in this way is then disintegrated. The disintegrated powder is wet-mixed in a ball mill with an organic binder and a dispersant in the presence of a solvent such as purified water. The resulting mixture is shaped into a ceramic article through pressing or similar.

The ceramic article is then fired in a reducing atmosphere at a predetermined temperature (e.g., 1000° C. to 1200° C.) in a reducing atmosphere (e.g., an oxygen partial pressure of $1.0 \times 10^{-11}$ to $1.0 \times 10^{-14}$ MPa). This produces a sintered ceramic body.

Then an electrode made of a Ni—Cu alloy, Ag, or similar is formed on each main surface of the sintered ceramic body, poling is performed through a predetermined period of application of a predetermined electric field in insulating oil warmed to a predetermined temperature (e.g., 80° C.), silicone oil or similar, and the electrodes are removed. This produces a piezoelectric ceramic.

This method for producing a piezoelectric ceramic, therefore, includes a weighing step that involves weighing out ceramic raw materials including an alkali metal compound containing an alkali metal, a Sn compound containing divalent Sn, a Nb compound containing Nb, and a Zr compound containing Zr, a calcination step that involves mixing the weighed ceramic raw materials and subsequently calcining the mixture in a reducing atmosphere to produce a ceramic feedstock powder, an article-shaping step that involves shaping the ceramic feedstock powder into an article, and a firing step that involves firing the article in a reducing atmosphere. Through the heating of the Sn compound containing divalent Sn and the Zr compound in a reducing atmosphere, this method allocates Sn in site A and Zr in site B without changing their valence, thereby yielding a piezoelectric ceramic having a good humidity service life and high reliability.

The following describes a piezoelectric ceramic electronic component produced using an above-described piezoelectric ceramic.

Figure 2:
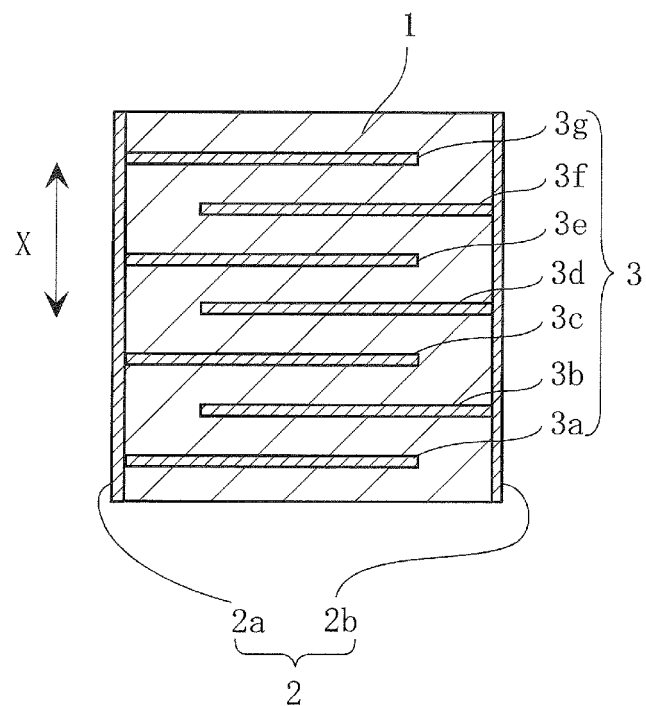
FIG. 2 is a cross-sectional diagram illustrating an embodiment of a multilayer piezoelectric actuator as a piezoelectric ceramic electronic component according to the present invention.

FIG. 2 is a cross-sectional diagram illustrating an embodiment of a multilayer piezoelectric actuator as a piezoelectric ceramic electronic component according to the present invention. The multilayer piezoelectric actuator includes a piezoelectric ceramic body 1 and outer electrodes 2 (2a and 2b) formed on both end portions of the piezoelectric ceramic body 1 and made of a conductive material such as Ag. The ceramic body 1 is a sintered form of an alternate stack of piezoelectric ceramic layers made of a piezoelectric ceramic composition according to the present invention and inner electrodes 3 (3a to 3g) made of a conductive material that contains Ni as its main ingredient.

The multilayer piezoelectric actuator has one end of its inner electrodes 3a, 3c, 3e, and 3g electrically coupled to one outer electrode 2a, and one end of its inner electrodes 3b, 3d, and 3f electrically coupled to the other outer electrode 2b. Applying voltage between the outer electrode 2a and the outer electrode 2b induces a displacement in the direction of stacking, indicated by arrow X, in the multilayer piezoelectric actuator as a result of a longitudinal piezoelectric effect.

The following describes a method for producing this multilayer piezoelectric actuator in detail.

First, the above-described method and procedure are performed to produce a ceramic feedstock powder through calcination in a reducing atmosphere.

The ceramic feedstock powder obtained in this way is then disintegrated. The disintegrated powder is wet-mixed in a ball mill with an organic binder and a dispersant in the presence of a solvent such as purified water, forming ceramic slurry. The ceramic slurry is shaped into ceramic green sheets using a doctor blade or any similar method.

Figure 3:
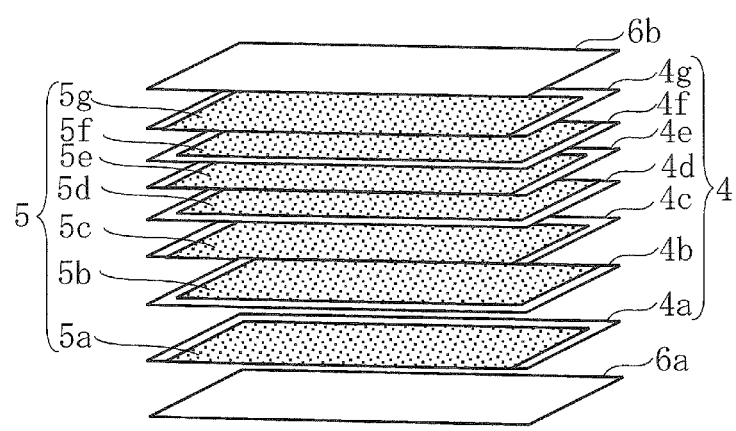
FIG. 3 is a perspective view of ceramic green sheets obtained in the process of the production of the same multilayer piezoelectric actuator.

Then through the application of a conductive paste for inner electrodes, a paste containing Ni as its main ingredient, by screen printing, conductive layers 5 (5a to 5g) in a predetermined shape are formed on the ceramic green sheets 4 (4a to 4g) as illustrated in FIG. 3.

The ceramic green sheets 4a to 4g having the conductive layers 5a to 5g formed thereon are stacked and held between ceramic green sheets 6a and 6b, on which the conductive layers 5a to 5g have not been formed, and pressure-bonded. This produces a ceramic multilayer body in which the conductive layers 5a to 5g and the ceramic green sheets 4a to 4g are alternately stacked. This ceramic multilayer body is cut into a predetermined size, and the workpiece is placed in a sagger made of alumina. After debinding at a predetermined temperature (e.g., 250° C. to 500° C.), the workpiece is fired at a predetermined temperature (e.g., 1000° C. to 1200° C.) in a reducing atmosphere to form a piezoelectric ceramic body (sintered ceramic body) 1 with inner electrodes 3a to 3g embedded therein.

Figure 4:
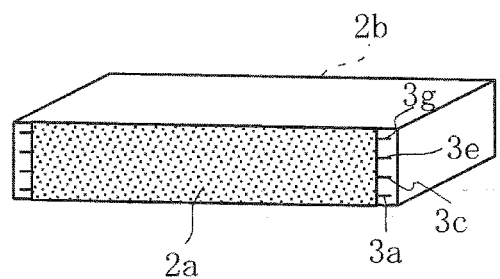
FIG. 4 is a perspective view of the same multilayer multilayer piezoelectric actuator.

Then a conductive paste for outer electrodes, a paste of a Ni—Cu alloy, Ag, or similar, is applied to each main surface of the piezoelectric ceramic body 1 and baked at a predetermined temperature (e.g., 750° C. to 850° C.) to form outer electrodes 2a and 2b as illustrated in FIG. 4.

After that, poling is performed through a predetermined period of application of a predetermined electric field in insulating oil, such as silicone oil, warmed to a predetermined temperature (e.g., 80° C.). This produces a multilayer piezoelectric actuator.

The outer electrodes 2a and 2b only need to be in close contact and may be formed using a thin-film formation method such as sputtering or vacuum deposition.

This multilayer piezoelectric actuator, therefore, uses ceramic green sheets (ceramic layers) 4 made of an aforementioned piezoelectric ceramic and inner electrodes containing Ni as their main ingredient. This provides a multilayer piezoelectric actuator having a good humidity service life and good piezoelectricity.

The present invention is not limited to the above embodiments. For example, the piezoelectric ceramic needs to contain 50% by weight alkali niobate compound as its main ingredient, but may optionally contain any other ingredients.

Furthermore, the present invention requires that there exist Sn in part of site A and Zr in part of site B, and this means that part of Sn or Zr may segregate in grain boundaries or triple points, rather than forming a solid solution with the main ingredient.

The same applies to the piezoelectric ceramic electronic component. The above-described multilayer piezoelectric actuator is for illustrative purposes and in addition to multilayer piezoelectric actuators, needless to say, the present invention can be applied to a wide variety of single-plate and other piezoelectric components that operate using piezoelectricity.

The following provides a detailed description of some examples of the present invention.

Example 1

Production of Samples

First, the following ceramic raw materials were prepared: $K_2CO_3$, $Na_2CO_3$, $Li_2CO_3$, $Nb_2O_5$, $SnO$, $SnO_2$, $CaCO_3$, $ZrO_2$, $TiO_2$, and $MnCO_3$.

These ceramic raw materials were weighed out in such amounts that M1, M2, x, and y in general formula (2) were as in the formulation in Table 1.

$$100((1-x)(1-y)(K_{0.49}Na_{0.49}Li_{0.02})NbO_3-xM1-yM2)+5MnO \quad (2)$$

In general formula (2), M1 and M2 indicate presence as a component of a solid solution in any of sites A and B of $(K_{0.49}Na_{0.49}Li_{0.02})NbO_3$.

The weighed materials were then mixed and milled with PSZ balls and ethanol in a pot mill for approximately 90 hours. The obtained mixture was dried, and calcined in a reducing atmosphere with a partial oxygen pressure of $1.0 \times 10^{-10}$ MPa or an air atmosphere, yielding a ceramic feedstock powder. The temperature for calcination was 900° C. in both a reducing atmosphere and an air atmosphere.

After being disintegrated, the ceramic feedstock powder was mixed and milled with an organic binder, a dispersant, purified water, and PSZ balls in a pot mill to form ceramic slurry.

The ceramic slurry was then shaped using a doctor blade into 120-μm-thick ceramic green sheets.

A number of these ceramic green sheets were then stacked to a thickness of approximately 1 mm and pressure-bonded under a pressure of approximately $2.45 \times 10^7$ Pa. A 10-mm-diameter disk was then punched out of the resulting laminate. This produced ceramic articles with sample numbers 1 to 9.

Each of the ceramic articles with sample numbers 1 to 9 was fired for 2 hours at a temperature of 1000° C. to 1160° C. in a reducing atmosphere with a controlled oxygen partial pressure of $1.0 \times 10^{-11}$ to $1.0 \times 10^{-14}$ MPa, yielding a sintered ceramic body as a piezoelectric ceramic body.

An outer electrode made of a Ni—Cu alloy was then formed on each main surface of this piezoelectric ceramic body using sputtering.

Then poling was performed through 30 minutes of application of an electric field of 3.0 kV/mm in silicone oil at 80° C. This produced samples with sample numbers 1 to 9.

Each of the samples with sample numbers 1 to 9 was structurally characterized using an X-ray diffractometer, demonstrating that all samples had a perovskite crystal structure.

[Evaluation of the Samples]

Each of the samples with sample numbers 1 to 9 was subjected to a compositional analysis using ICP emission spectrometry for the molar ratio of Sn to alkali metals (hereinafter referred to as "Sn/AL"), the molar ratio of Zr to alkali metals (hereinafter referred to as "Zr/AL"), and the molar ratio of Mn to alkali metals (hereinafter referred to as "Mn/AL").

Each of the samples was then measured for the electromechanical coupling coefficient kp for vibrations in the radial direction, the piezoelectric constant $d_{33}$, and humidity service life.

The electromechanical coupling coefficient kp was determined through the resonance-antiresonance method using an impedance analyzer.

The piezoelectric constant $d_{33}$ was determined from the amount of charge generated under an excitation force of 0.25 N rms applied using a $d_{33}$ meter.

As for humidity service life, a sinusoidal electric field of 0.5 kV/mm was applied in the direction of polarization at a temperature of 85° C., a relative humidity of 85%, and a frequency of 1 Hz, and the insulation resistance was measured at 100 hours, 200 hours, 300 hours, 400 hours, and 500 hours after the start of the application of the sinusoidal electric field. The time at which the insulation resistance had dropped to $1 \times 10^5$ Ω·cm or less was taken as humidity service life.

Table 1 summarizes the formulation of ingredients, Sn/AL, Zr/AL, Mn/AL, oxygen partial pressure at calcination, and measurement results (electromechanical coupling coefficient kp, piezoelectric constant $d_{33}$, and humidity service life) for each of the samples with sample numbers 1 to 9.

The sites where Sn and Zr existed in the solid solution were analyzed through scanning transmission electron microscopic (STEM) observations or confirmed through EXAFS analysis.

As for sample number 1, ingredient M1 was SnO, a compound containing divalent Sn, and ingredient M2 was $ZrO_2$. The calcination was in a reducing atmosphere with an oxygen partial pressure of $1.0 \times 10^{-10}$ MPa. These conditions allowed Sn to exist in site A in the solid solution without being oxidized and Zr in site B in the solid solution. As a result, the humidity service life was 500 hours or more.

TABLE 1

| Sample No. | $100((1-x)(1-y)(K_{0.49}Na_{0.49}Li_{0.02})NbO_3 - xM1 - yM2) + 5MnO$ | | | | Sn/AL | Zr/AL | Mn/AL | Oxygen partial pressure at calcination (MPa) | Measurement results | | |
|---|---|---|---|---|---|---|---|---|---|---|---|
| | M1 | M2 | x | y | | | | | Electromechanical coupling coefficient kp (%) | Piezo-electric constant $d_{33}$ (pC/N) | Humidity service life (h) |
| 1 | SnO | $ZrO_2$ | 0.045 | 0.050 | 0.047 | 0.052 | 0.052 | $1.0 \times 10^{-10}$ | 34.4 | 190 | ≥500 |
| 2*[1] | SnO | $ZrO_2$ | 0.045 | 0.050 | 0.048 | 0.053 | 0.053 | Air atmosphere | 13.7 | 40 | 100 |
| 3*[1] | SnO | $TiO_2$ | 0.045 | 0.050 | 0.048 | 0.000 | 0.053 | $1.0 \times 10^{-10}$ | 11.7 | 28 | 100 |
| 4*[1] | $SnO_2$ | $TiO_2$ | 0.045 | 0.050 | 0.047 | 0.000 | 0.052 | $1.0 \times 10^{-10}$ | 12.7 | 30 | 100 |
| 5*[1] | $SnO_2$ | $ZrO_2$ | 0.045 | 0.050 | 0.047 | 0.052 | 0.052 | $1.0 \times 10^{-10}$ | 18.3 | 65 | 100 |
| 6*[1] | $SnO_2$ | $ZrO_2$ | 0.045 | 0.050 | 0.049 | 0.054 | 0.053 | Air atmosphere | 12.7 | 36 | 200 |
| 7*[1] | $CaCO_3$ | $ZrO_2$ | 0.045 | 0.050 | 0.000 | 0.053 | 0.053 | $1.0 \times 10^{-10}$ | 22.1 | 103 | 300 |
| 8*[1] | $CaCO_3$ | $ZrO_2$ | 0.045 | 0.050 | 0.000 | 0.053 | 0.052 | Air atmosphere | 22.7 | 105 | 300 |
| 9*[1] | SnO | — | 0.045 | 0.000 | 0.049 | 0.000 | 0.052 | $1.0 \times 10^{-10}$ | 28.1 | 132 | 100 |

[1] Out of the scope of the present invention

Sample number 2 had a short humidity service life of 100 hours. This appears to be because the calcination in an air atmosphere caused divalent Sn (SnO) to be oxidized into tetravalent Sn ($SnO_2$) during calcination and, therefore, Sn to exist in site B in the solid solution, preventing a desired humidity service life from being achieved.

For sample number 3, there existed Ti in site B in the solid solution, and there was no Zr in site B. This resulted in a short humidity service life of 100 hours, indicating the sample was of low reliability.

For sample number 4, Ti was present in site B in the solid solution as in sample number 3, and the use of $SnO_2$, a tetravalent Sn-containing compound, as ingredient M1 caused Sn to exist in site B in the solid solution. This resulted in a short humidity service life of 100 hours, indicating the sample was of low reliability.

For sample number 5, Zr was present in site B in the solid solution, but the use of $SnO_2$, a tetravalent Sn-containing compound, as ingredient M1 in the same way as for sample number 4 caused Sn also to exist in site B in the solid solution. This resulted in a short humidity service life of 100 hours, indicating the sample was of low reliability.

For sample number 6, Zr was present in site B in the solid solution, but the use of $SnO_2$ as ingredient M1 in the same way as for sample number 4 and the calcination in an air atmosphere caused Sn also to readily exist in site B in the solid solution. This resulted in a short humidity service life of 200 hours, indicating the sample was of low reliability.

For sample numbers 7 and 8, Zr was present in site B in the solid solution, but there existed Ca in site A in the solid solution. This resulted in a short humidity service life of 300 hours regardless of the atmosphere for calcination, indicating the samples were of low reliability.

For sample number 9, Sn was in site A in the solid solution, but there was no Zr in site B in the solid solution. This also resulted in a short humidity service life of 100 hours, indicating the sample was of low reliability.

This example therefore revealed that for a desired good humidity service life to be obtained, it is important to ensure that there exists Sn in part of site A and Zr in part of site B and that doing so limits insulation resistance drops even in long-time and continuous operation under hot and humid conditions, thereby providing a highly reliable piezoelectric ceramic that maintains its humidity service life for 500 hours or more.

Example 2

The following ceramic raw materials were prepared: $K_2CO_3$, $Na_2CO_3$, $Li_2CO_3$, $Nb_2O_5$, SnO, $ZrO_2$, and $MnCO_3$.

Samples with sample numbers 11 to 14 were then produced through the same method and procedure as in Example 1, except that the ceramic raw materials were weighed out in such amounts that M1, M2, x, and y in general formula (3) were as in the formulation in Table 2 and that the calcination was in a reducing atmosphere with an oxygen partial pressure of $1.0 \times 10^{-10}$ MPa.

$$100((K_{0.49}Na_{0.49}Li_{0.02})_{1-x}M1_x)(Nb_{1-y}M2y)O_3 + 5MnO \qquad (3)$$

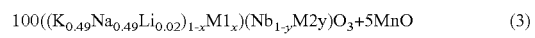

For each of the samples with sample numbers 11 to 14, the same method and procedure as in Example 1 were followed to determine Sn/AL, Zr/AL, and Mn/AL and to measure the electromechanical coupling coefficient kp, the piezoelectric constant $d_{33}$, and the humidity service life.

Table 2 summarizes the formulation of ingredients, Sn/AL, Zr/AL, Mn/AL, atmosphere for calcination, and measurement results for each of the samples with sample numbers 11 to 14.

TABLE 2

| Sample No. | 100(($K_{0.49}Na_{0.49}Li_{0.02})_{1-x}M1_x$)(Nb$_{1-y}$M2$_y$)O$_3$ + 5MnO | | | | Sn/AL | Zr/AL | Mn/AL | Oxygen partial pressure at calcination (MPa) | Measurement results | | |
|---|---|---|---|---|---|---|---|---|---|---|---|
| | M1 | M2 | x | y | | | | | Electromechanical coupling coefficient kp (%) | Piezoelectric constant $d_{33}$ (pC/N) | Humidity service life (h) |
| 11*[2] | SnO | ZrO$_2$ | 0.001 | 0.001 | 0.001 | 0.001 | 0.051 | $1.0 \times 10^{-10}$ | 18 | 50 | ≥500 |
| 12 | SnO | ZrO$_2$ | 0.004 | 0.004 | 0.005 | 0.006 | 0.051 | $1.0 \times 10^{-10}$ | 30.5 | 145 | ≥500 |
| 13 | SnO | ZrO$_2$ | 0.080 | 0.090 | 0.090 | 0.098 | 0.055 | $1.0 \times 10^{-10}$ | 33 | 167 | ≥500 |
| 14*[2] | SnO | ZrO$_2$ | 0.100 | 0.100 | 0.120 | 0.110 | 0.056 | $1.0 \times 10^{-10}$ | 22.6 | 115 | ≥500 |

*[2])Out of the scope of the present invention

Sample numbers 11 to 14, for all of which there existed Sn in site A in the solid solution and Zr in site B, had a humidity service life of 500 hours or more, thus found to be highly reliable with limited insulation resistance drops even in long-time and continuous operation under hot and humid conditions.

For sample number 11, however, Sn/AL and Zr/AL were both as small as 0.001, and therefore the molar quantities of Sn and Zr relative to alkali metals were small. As a result, the electromechanical coupling coefficient kp was as small as 18%, and the piezoelectric constant $d_{33}$ was as low as 50 pC/N.

For sample number 14, Sn/AL and Zr/AL were both as large as 0.120 and 0.110, respectively, and therefore the molar quantities of Sn and Zr relative to alkali metals were too large. This likewise resulted in a small electromechanical coupling coefficient kp of 22.6% and a low piezoelectric constant $d_{33}$ of 115 pC/N.

As for sample numbers 12 and 13, Sn/AL and Zr/AL were in the range of 0.005 to 0.100. The electromechanical coupling coefficient kp was as large as 30.5% to 33%, and for piezoelectric coefficient $d_{33}$, a high piezoelectric constant of 145 to 167 pC/N was obtained.

This example therefore demonstrated that ensuring there exists Sn in site A in the solid solution and Zr in site B results in a desired good humidity service life, but for the electromechanical coupling coefficient kp and the piezoelectric constant $d_{33}$ to be better, the individual ingredients need to be compounded in such proportions that Sn/AL and Zr/AL will be in the range of 0.005 to 0.100.

Example 3

As in Example 2, the following ceramic raw materials were prepared: K$_2$CO$_3$, Na$_2$CO$_3$, Li$_2$CO$_3$, Nb$_2$O$_5$, SnO, ZrO$_2$, and MnCO$_3$.

Samples with sample numbers 21 to 25 were then produced through the same method and procedure as in Example 1, except that the ceramic raw materials were weighed out in such amounts that M1, M2, x, y, and α in general formula (4) were as in the formulation in Table 3 and that the calcination was in a reducing atmosphere with an oxygen partial pressure of $1.0 \times 10^{-10}$ MPa.

$$100((K_{0.49}Na_{0.49}Li_{0.02})_{1-x}M1_x)(Nb_{1-y}M2_y)O_3 + \alpha MnO \qquad (4)$$

For each of the samples with sample numbers 21 to 25, the same method and procedure as in Example 1 were followed to determine Sn/AL, Zr/AL, and Mn/AL and to measure the electromechanical coupling coefficient kp, the piezoelectric constant $d_{33}$, and the humidity service life.

Table 3 summarizes the formulation of ingredients, Sn/AL, Zr/AL, Mn/AL, atmosphere for calcination, and measurement results for each of the samples with sample numbers 21 to 25.

TABLE 3

| Sample No. | 100(($K_{0.49}Na_{0.49}Li_{0.02})_{1-x}M1_x$)(Nb$_{1-y}$M2$_y$)O$_3$ + αMnO | | | | | Sn/AL | Zr/AL | Mn/AL | Oxygen partial pressure at calcination (MPa) | Measurement results | | |
|---|---|---|---|---|---|---|---|---|---|---|---|---|
| | M1 | M2 | x | y | α | | | | | Electromechanical coupling coefficient kp (%) | Piezoelectric constant $d_{33}$ (pC/N) | Humidity service life (h) |
| 21*[3] | SnO | ZrO$_2$ | 0.045 | 0.050 | 1 | 0.049 | 0.054 | 0.011 | $1.0 \times 10^{-10}$ | 18.8 | 60 | ≥500 |
| 22 | SnO | ZrO$_2$ | 0.045 | 0.050 | 2 | 0.048 | 0.053 | 0.021 | $1.0 \times 10^{-10}$ | 34.5 | 185 | ≥500 |
| 23 | SnO | ZrO$_2$ | 0.045 | 0.050 | 9 | 0.047 | 0.052 | 0.094 | $1.0 \times 10^{-10}$ | 30.3 | 152 | ≥500 |
| 24*[3] | SnO | ZrO$_2$ | 0.045 | 0.050 | 15 | 0.047 | 0.052 | 0.160 | $1.0 \times 10^{-10}$ | 22.5 | 115 | ≥500 |
| 25*[3] | SnO | ZrO$_2$ | 0.045 | 0.050 | 0 | 0.047 | 0.052 | 0.000 | $1.0 \times 10^{-10}$ | 15 | 52 | ≥500 |

*[3])Out of the scope of the present invention

Sample numbers 21 to 25, for all of which there existed Sn in site A in the solid solution and Zr in site B, had a humidity service life of 500 hours or more, thus found to be highly reliable with limited insulation resistance drops even in long-time and continuous operation under hot and humid conditions.

For sample number 21, however, Mn/AL was as small as 0.011, and therefore the molar quantity of Mn relative to alkali metals was small. As a result, the electromechanical coupling coefficient kp was as small as 18.8%, and the piezoelectric constant $d_{33}$ was as low as 60 pC/N.

For sample number 25, no Mn was contained. This likewise resulted in a small electromechanical coupling coefficient kp of 15% and a low piezoelectric constant $d_{33}$ of 52 pC/N.

For sample number 24, the value of Mn/AL was as large as 0.160, and therefore the molar quantity of Mn relative to alkali metals was too large. This likewise resulted in a small electromechanical coupling coefficient kp of 22.5% and a low piezoelectric constant $d_{33}$ of 115 pC/N.

As for sample numbers 22 and 23, Mn/AL was in the range of 0.02 to 0.10. The electromechanical coupling coefficient kp was as large as 30.3% to 34.5%, and for piezoelectric coefficient $d_{33}$, a high piezoelectric constant of 152 to 185 pC/N was obtained.

This example therefore demonstrated that ensuring there exists Sn in site A in the solid solution and Zr in site B, even with no Mn contained, results in a desired good humidity service life, but Mn may optionally be contained, and in such a case, compounding the individual ingredients in such proportions that Mn/AL will be in the range of 0.02 to 0.10 improves the electromechanical coupling coefficient kp and the piezoelectric constant $d_{33}$.

Example 4

Sample number 1 of Example 1 and sample number 13 of Example 2, which were both samples according to the present invention, and sample number 6 of Example 1, a sample out of the scope of the present invention, were prepared. These samples were characterized using the EXAFS analysis for the local structure existing around a Sn atom.

First, a powder of the sample with sample number 1 placed in an X-ray absorption spectrometer was irradiated with an X-ray at continuously varying energies at a room temperature of 25° C., and a K-edge X-ray absorption spectrum of Sn was obtained. The X-ray absorption spectrum revealed that the range of the photon energies representing the Sn—K absorption edge, where the absorbance suddenly increased, was 29170 eV to 29240 eV.

The X-ray absorption spectrum was then differentiated twice, and the energy where the derivative equaled 0 was taken as the origin for wave numbers. The pre-edge background was then defined using a linear function, with the pre-edge region defined as energies lower than the photon energy as the origin for wave numbers by 50 eV to 200 eV. This pre-edge background was subtracted from the X-ray absorption spectrum, giving a modified X-ray absorption spectrum.

The post-edge background of this modified X-ray absorption spectrum was then defined using a spline function derived by the AUTOBK algorithm, with the post-edge region, the region on the high-energy side with respect to the K-absorption edge of Sn, defined as energies higher than the origin for wave numbers by 500 eV or more. The modified X-ray absorption spectrum was normalized to make the mean height of the post-edge background "1." After the normalization of the modified X-ray absorption spectrum, the EXAFS vibration was extracted through the subtraction of the post-edge background from the post-edge X-ray absorption spectrum. The photon energies were then converted into the wave numbers k with the origin for wave numbers as baseline (=0 Å$^{-1}$) (1 Å=0.1 nm), and the vibration intensities were multiplied by the cube of the wave numbers k to construct the EXAFS vibration.

As mentioned in the Description of Embodiments, in the EXAFS method, the EXAFS vibration χ(k) is described by mathematical representation (1) in accordance with the multiple-scattering theory for photoelectrons.

From the obtained EXAFS vibration, a radial distribution function was derived through a Fourier transform setting a Hanning window as the window function. In the Hanning window, the window width was the range of wave numbers k of 3 Å$^{-1}$ to 11 Å$^{-1}$ and a slope width of 1 Å$^{-1}$.

The inventors then created a model where sites A and B of $(K_{0.5}Na_{0.5})NbO_3$ in the tetragonal perovskite structure were substituted with Sn, and computed a theoretical radial distribution function on the FEFF program. Curve fitting was performed to compare it with the measured radial distribution function, with the percentage presence of Sn in sites A and B in the solid solution and the distance r between the Sn atom in each site and an O atom as parameters.

Figure 5:
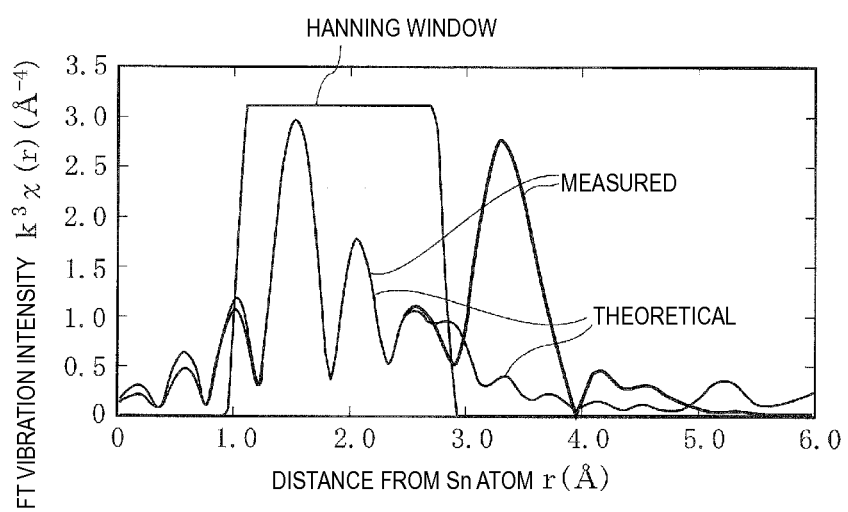
FIG. 5 is a diagram illustrating measured and radial theoretical distribution functions for sample number 1, obtained from a K-edge X-ray absorption spectrum of Sn.

FIG. 5 illustrates measured and theoretical radial distribution functions for sample number 1. In the diagram, the horizontal axis represents the distance from the Sn atom r, and the vertical axis the intensity of vibration after the Fourier transform (FT vibration intensity) $k^3\chi(r)$.

As can be clearly seen from FIG. 5, the measured and theoretical radial distribution functions were in substantial agreement within the window function.

The radial distribution functions for sample numbers 6 and 13 were also derived from a K-edge X-ray absorption spectrum of Sn and compared with the respective theoretical radial distribution functions through curve fitting. Substantial agreement was observed between the measured and theoretical functions in the same way as in FIG. 5.

The percentage presence of Sn in site A in the solid solution determined through the curve fitting was 46% for sample number 1 and 22% for sample number 13. For sample number 6, however, it was 0%.

Then theoretical radial distribution functions were derived on the FEFF program assuming that the percentage presence of Sn, out of the quantity of Sn added, in site A in the solid solution was 0%, 10%, 30%, 50%, 70%, 90%, or 100%.

Figure 6:
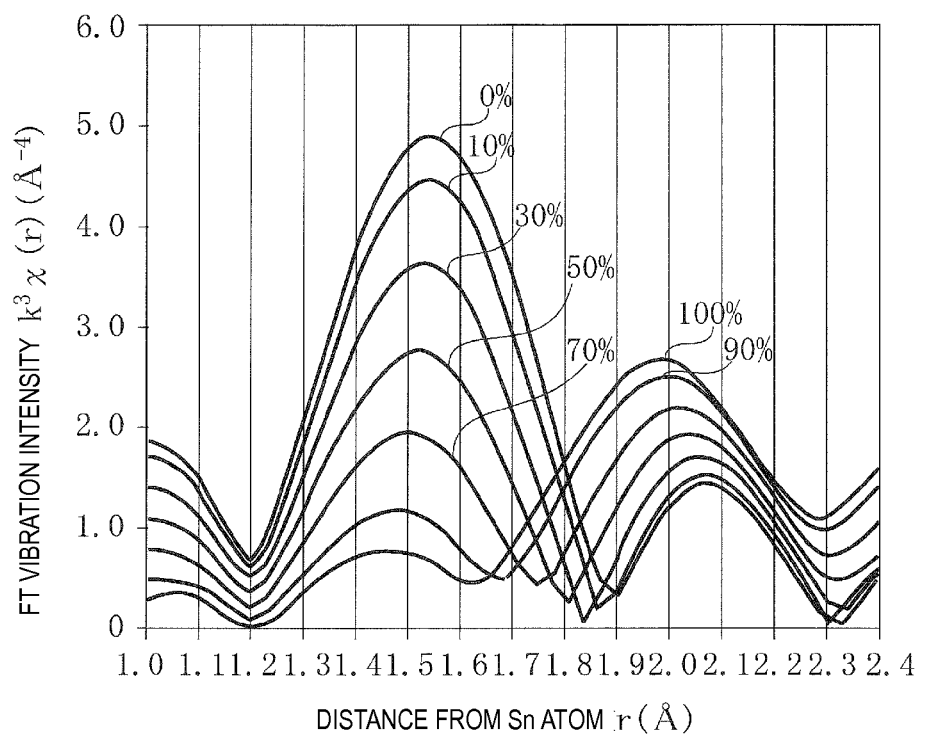
FIG. 6 is a diagram illustrating radial distribution functions with the percentage presence of Sn in site A in the solid solution as a parameter.

FIG. 6 illustrates the results of measurement. The horizontal axis is the distance from the Sn atom r (Å), and the vertical axis is the FT vibration intensity $k^3\chi(r)$ (Å$^{-4}$).

As is clear from FIG. 6, the functions, even with different percentages of the presence of Sn in site A in the solid solution, have a first peak intensity P1 in the range of the distances r from the Sn atom of 1.2 Å to 1.8 Å and a second peak intensity P2 in the range of the distances r from the Sn atom of 1.8 Å to 2.4 Å.

In an alkali niobate compound having a perovskite crystal structure, the distance between a site-A atom and a coordinating O atom is greater than that between a site-B atom and a coordinating O atom. In other words, the interatomic distance between a Sn atom in site A and a coordinating O atom (the second distance r2) is greater than that between a Sn atom in site B and a coordinating O atom (the first distance r1). The first peak intensity P1 should therefore represent the presence of Sn in site B in the solid solution, and the second peak intensity P2 the presence of Sn in site A in the solid solution.

This means that decreasing percentage presence of Sn in site A in the solid solution makes the first peak intensity P1 higher and the second peak intensity P2 lower, and increasing percentage presence of Sn in site A in the solid solution makes the first peak intensity P1 lower and the second peak intensity P2 higher. In terms of the peak intensity ratio P1/P2, therefore, increasing percentage presence of Sn in site A in the solid solution makes the peak intensity ratio P1/P2 lower, and decreasing percentage presence of Sn in site A in the solid solution makes the peak intensity ratio P1/P2 higher.

The inventors then determined the relationship between the peak intensity ratio P1/P2 and the percentage presence of Sn in site A in the solid solution.

Figure 7:
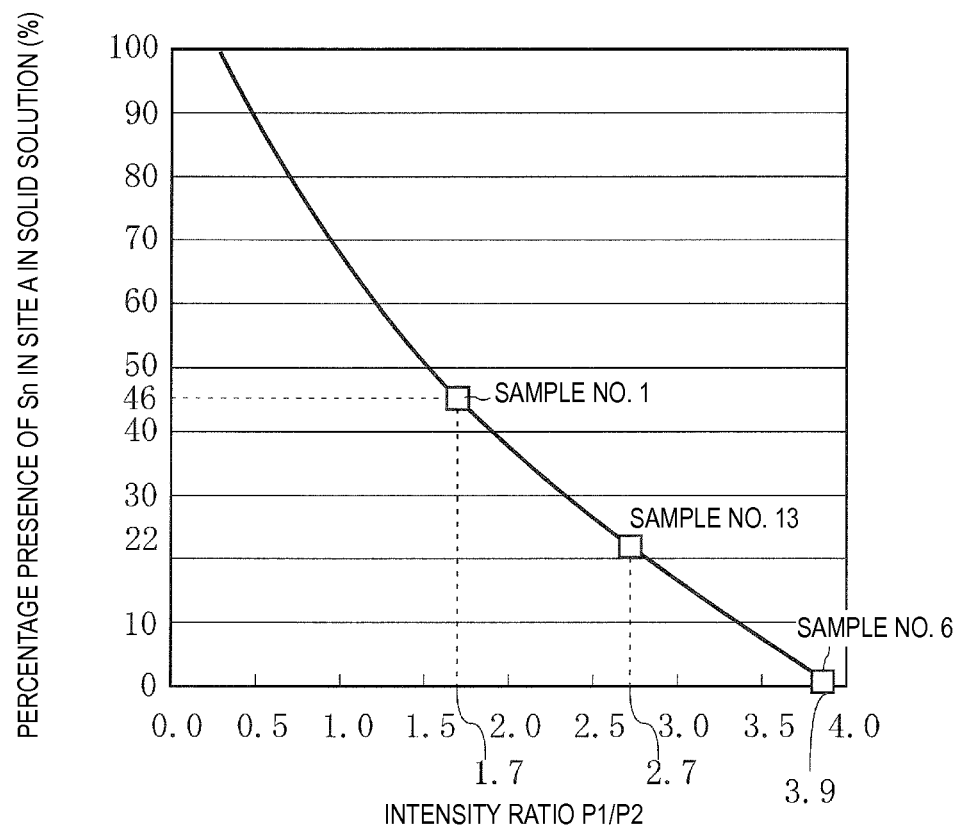
FIG. 7 is a diagram illustrating the relationship between the peak intensity ratio P1/P2 and the percentage presence of Sn in the solid solution.

FIG. 7 is a diagram illustrating the relationship between the peak intensity ratio P1/P2 and the percentage presence of Sn in site A in the solid solution. The horizontal axis is the peak intensity ratio P1/P2, and the vertical axis is the percentage presence of Sn in site A in the solid solution (%). The curve in the diagram is a spline curve connecting the points of the peak intensity ratios P1/P2 determined from the theoretical radial distribution functions derived assuming that the percentage presence of Sn in site A in the solid solution was 0%, 10%, 30%, 50%, 70%, 90%, or 100%, with the □ signs indicating measurements from sample numbers 1, 6, and 13.

Sample number 6, for which the percentage presence of Sn in site A in the solid solution was 0%, had an accordingly high peak intensity ratio of 3.9.

In contrast, sample numbers 1 and 13, for which the percentages of presence in site A in the solid solution were 22% and 46%, respectively, both falling within a range according to the present invention, had peak intensity ratios P1/P2 of 1.7 and 2.7, respectively, both lower than 3. The simulated curve therefore revealed that when the peak intensity ratio P1/P2 is 2.7 or less, there exists sufficient Sn in site A in the solid solution and this, together with the presence of Zr in site B, ensures a good humidity service life as demonstrated in Examples 1 and 2.

Ensuring that there exists Sn in site A in the solid solution and Zr in site B in the solid solution and specifying the two peak intensity ratios in a radial distribution function obtained from a K-edge X-ray absorption spectrum of Sn provide a highly reliable piezoelectric ceramic that has a good humidity service life as it experiences only limited insulation resistance drops even in long-time and continuous operation under hot and humid conditions. Furthermore, specifying the molar ratios of Sn and Zr relative to alkali metals improves piezoelectric properties such as the electromechanical coupling coefficient and the piezoelectric constant.

REFERENCE SIGNS LIST

Piezoelectric ceramic body
2a, 2b Outer electrodes
3a to 3g Inner electrodes

The invention claimed is:

1. A piezoelectric ceramic comprising an alkali niobate compound as a main ingredient, the alkali niobate compound having a perovskite crystal structure represented by $A_mBO_3$ and containing at least one alkali metal, wherein
Sn exists in part of site A and Zr exists in part of site B.

2. The piezoelectric ceramic according to claim 1, wherein the at least one alkali metal is selected from K, Na, and Li.

3. The piezoelectric ceramic according to claim 1, wherein a first molar quantity of the Sn relative to a second molar quantity of the at least one alkali metal, expressed as a first molar ratio, is in a range of 0.005 to 0.100, and a third molar quantity of the Zr relative to the second molar quantity of the at least one alkali metal, expressed as a second molar ratio, is in a range of 0.005 to 0.100.

4. The piezoelectric ceramic according to claim 3, further comprising Mn, and wherein a fourth molar quantity of the Mn relative to the second molar quantity of the at least one alkali metal, expressed as a third molar ratio, is in a range of 0.02 to 0.10.

5. The piezoelectric ceramic according to claim 1, further comprising Mn, and wherein a molar quantity of the Mn relative to a molar quantity of the at least one alkali metal, expressed as a molar ratio, is in a range of 0.02 to 0.10.

6. A piezoelectric ceramic electronic component comprising:
a piezoelectric ceramic body; and
an outer electrode adjacent a surface of the piezoelectric ceramic body,
wherein the piezoelectric ceramic body is a piezoelectric ceramic according to claim 1.

7. The piezoelectric ceramic electronic component according to claim 6, wherein the piezoelectric ceramic body has an inner electrode embedded therein, the inner electrode containing Ni as a main ingredient.

8. A piezoelectric ceramic comprising an alkali niobate compound as a main ingredient, the alkali niobate compound having a perovskite crystal structure and containing at least one alkali metal, and Sn and Zr, wherein
a radial distribution function obtained from a K-edge X-ray absorption spectrum of the Sn has a first peak intensity P1 at a first distance r1 from an atom of the Sn and a second peak intensity P2 at a second distance r2 from the atom of the Sn,
the second distance r2 being greater than the first distance r1 and a peak intensity ratio P1/P2 is 2.7 or less.

9. The piezoelectric ceramic according to claim 8, wherein the peak intensity ratio P1/P2 is 1.7 or more and 2.7 or less.

10. The piezoelectric ceramic according to claim 8, wherein the perovskite crystal structure is represented by $A_mBO_3$, and the first peak intensity P1 represents presence of the Sn in site B in solid solution, and the second peak intensity P2 represents presence of the Sn in site A in solid solution.

11. The piezoelectric ceramic according to claim 8, wherein the peak intensity ratio P1/P2 is calculated through analysis of a radial distribution function derived from an EXAFS vibration obtained from a K-edge X-ray absorption spectrum of the Sn.

12. The piezoelectric ceramic according to claim 8, wherein the X-ray absorption spectrum is measured at room temperature.

13. The piezoelectric ceramic according to claim 8, wherein the at least one alkali metal is selected from K, Na, and Li.

14. The piezoelectric ceramic according to claim 8, wherein a first molar quantity of the Sn relative to a second molar quantity of the at least one alkali metal, expressed as a first molar ratio, is in a range of 0.005 to 0.100, and a third molar quantity of the Zr relative to the second molar quantity of the at least one alkali metal, expressed as a second molar ratio, is in a range of 0.005 to 0.100.

15. The piezoelectric ceramic according to claim 14, further comprising Mn, and wherein a fourth molar quantity of the Mn relative to the second molar quantity of the at least one alkali metal, expressed as a third molar ratio, is in a range of 0.02 to 0.10.

16. The piezoelectric ceramic according to claim 8, further comprising Mn, and wherein a molar quantity of the Mn relative to a molar quantity of the at least one alkali metal, expressed as a molar ratio, is in a range of 0.02 to 0.10.

17. A piezoelectric ceramic electronic component comprising:
a piezoelectric ceramic body; and
an outer electrode adjacent a surface of the piezoelectric ceramic body, wherein the piezoelectric ceramic body is a piezoelectric ceramic according to claim 8.

* * * * *